(12) United States Patent
    Noori

(10) Patent No.: US 9,716,475 B1
(45) Date of Patent: Jul. 25, 2017

(54) PROGRAMMABLE LOW NOISE AMPLIFIER

(71) Applicant: Peregrine Semiconductor Corporation, San Diego, CA (US)

(72) Inventor: Hossein Noori, San Diego, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 15/003,463

(22) Filed: Jan. 21, 2016

(51) Int. Cl.
    *H03F 1/14* (2006.01)
    *H03F 3/04* (2006.01)
    *H03F 1/42* (2006.01)
    *H03F 3/195* (2006.01)

(52) U.S. Cl.
    CPC ............... *H03F 1/42* (2013.01); *H03F 3/195* (2013.01); *H03F 2200/231* (2013.01); *H03F 2200/294* (2013.01); *H03F 2200/451* (2013.01); *H03F 2200/72* (2013.01); *H03F 2200/75* (2013.01)

(58) Field of Classification Search
    CPC ..................................... H03F 1/14; H03F 3/04
    USPC .................................. 330/296, 295, 126, 51
    See application file for complete search history.

(56) References Cited

U.S. PATENT DOCUMENTS

| | | | | |
|---|---|---|---|---|
| 6,498,926 B1* | 12/2002 | Ciccarelli | ............. | H03F 1/0261 330/129 |
| 8,111,105 B1* | 2/2012 | Zhou | ....................... | H03F 1/233 330/300 |
| 2005/0068106 A1* | 3/2005 | Irvine | ................. | H03F 3/45188 330/260 |
| 2007/0222515 A1* | 9/2007 | Koutani | .............. | H01L 27/0207 330/254 |
| 2009/0015335 A1* | 1/2009 | Floyd | .................. | G06F 17/5063 330/282 |
| 2009/0207764 A1* | 8/2009 | Fukamachi | .............. | H04B 1/44 370/297 |
| 2012/0235746 A1* | 9/2012 | Li | ........................ | H03F 1/0261 330/261 |
| 2014/0043102 A1* | 2/2014 | Su | .......................... | H03F 3/193 330/295 |
| 2014/0139288 A1* | 5/2014 | Cha | ........................ | H03F 3/245 330/254 |

* cited by examiner

*Primary Examiner* — Patricia T Nguyen
(74) *Attorney, Agent, or Firm* — Jaquez Land Greenhaus LLP; Martin J. Jaquez, Esq.; Alessandro Steinfl, Esq.

(57) ABSTRACT

A selectable low noise amplifier (LNA) system comprising, a plurality of LNAs having a plurality of LNA characteristics and at least one selection switch network coupled to the plurality of LNAs to select at least one of the plurality of LNAs.

16 Claims, 9 Drawing Sheets

PROGRAMMABLE LOW NOISE AMPLIFIER

BACKGROUND

(1) Technical Field

The present disclosure relates to low noise amplifiers (LNAs) and more specifically to programming LNAs for linearity, gain, noise, and current.

(2) Background

Due to increasing use, frequency bands are being added to the mobile wireless spectrum. The number of users has been increasing in many countries and cell phones are made for a global market. The number of frequency bands is increasing and are used in urban and rural environments which presents a challenge on the design of RF front ends for the mobile devices.

One LNA cannot handle the spectrum of frequencies from 0.7 GHz to 3.6 GHz and provide acceptable performance, additionally, LNAs have stringent performance specifications. Since 2.9 GHz is too much bandwidth for one LNA, the spectrum is broken into multiple portions, handled by an LNA.

In the event that one LNA is handling a portion of the spectrum, it is fixed in respect to its performance within that portion of the spectrum. Therefore, if the LNA is used in a cell phone, whether in an urban environment or in a rural environment, its performance is fixed. Difficulties arise from the fact that in an urban environment and a rural environment different demands on the LNA present themselves. In an urban environment with much interference, a high linearity LNA may be optimum and in a rural environment with a possibly weak signal a high gain LNA may be optimum. One LNA cannot provide high linearity and high gain, so typically a compromise is designed in. The instant disclosure provides one possible solution by analyzing the RF signal within a band and switching to an LNA that best meets the incoming signal.

SUMMARY OF THE INVENTION

In one embodiment a selectable low noise amplifier (LNA) system comprising, a plurality of LNAs having a plurality of LNA characteristics and at least one selection switch network coupled to the plurality of LNAs to select at least one of the plurality of LNAs.

In a further embodiment a selectable low noise amplifier (LNA) system comprising, a plurality of selection switch networks and a plurality of LNAs coupled to at least one of the plurality of selection switch networks, the plurality of LNAs having a plurality of LNA characteristics, the plurality of selection switch networks to select at least one of the plurality of LNAs.

In yet a further embodiment a selectable low noise amplifier (LNA) system comprising: a plurality of LNAs having a plurality of LNA characteristics, a first pole coupled to a first LNA of the plurality of LNAs, a plurality of radio frequency inputs, a plurality of first switches coupling the first pole to the plurality of radio frequency inputs, the plurality of first switches having a thru topology directly linking the first pole to the plurality of radio frequency inputs, a second pole coupled to a second LNA of the plurality of LNAs and a plurality of second switches coupling the second pole to the plurality of radio frequency inputs, the plurality of second switches having a thru-shunt-thru topology linking the second pole to the plurality of radio frequency inputs.

In a further embodiment a method of low noise amplification comprising switching a band selection position to select an RF input frequency band, switching at least one selection switch network position to enable an LNA corresponding to the selected RF input frequency band, analyzing a signal strength of the enabled LNA, switching on at least one attenuator corresponding to the enabled LNA if the signal strength of the enabled LNA is above a pre-determined threshold and analyzing an output of the enabled LNA and corresponding attenuator to verify whether there is a valid signal present at an RF output.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

Currently, frequency bands are being added to the mobile wireless spectrum. The number of users has been increasing in many countries and cell phones are made for a global market. Mobile phones are used in both urban and rural environments, which present a challenge on the design of RF front ends for the mobile devices.

Antennas are typically wideband, so they can handle multiple bands. In order to get good performance, a switch is used to send the signals through filters to differentiate different bands. One band may be the North American band, so there is a command sent to this switch to tell the system to connect the antenna to this North American band path.

In one example, an antenna is provided that outputs one band per LNA so that it receives the RF signal and amplifies it, where the amplified signal may have three outputs. The next stage is that of the transceiver where the baseband is demodulated and then determine if the transmission is data or voice.

The baseband listens to the bands it can support that the mobile device is receiving. Locks to that band and if the RF signal is weak or strong and determines which LNA is enabled at which gain level.

A cell phone may move from downtown to a rural area in which case the frequencies allocated by the FCC for those carriers are typically lower so they can propagate further. Between the time the cell phone is turned on until it is operational, it is checking which bands are available and their signal strength.

The linearity, gain, noise figure, and current are primarily determined by the LNA of the receiver. Generally, for a given band of operation, an LNA is designed to meet fixed or minimally-adjustable performance specifications such as gain and current. However, when wide range of performance parameters is required, a one LNA approach may be inadequate.

One challenge is that customer demands are wide; as an example, the customer may request an LNA having low noise, high gain, low current, or high linearity. These customer requests are contradictory, if high linearity is sought, that precludes low noise, if high gain is sought, that precludes low current. One LNA cannot handle these contradictory requests. One possible solution to meet these contradictory requests is to split the LNA into more than one LNA. In this disclosure a plurality of LNAs is used to optimize performance for these contradictory requests. One LNA may be used for high gain low noise and one LNA may be used for low gain and high linearity. This allows control of LNA functionality depending upon environment. If the LNA is used in a mobile device in an urban environment, there are multiple cell sites and the signal is strong, so high gain is not a concern, there may be interference coming from the other users and other sites so the concern in that situation is to have high linearity. In rural areas the concerns are opposite; there may not be many users and cell sites, so the interference drops, in this case because of the distance between cell sites, high gain to amplify the signal is sought. Therefore LNA specifications are dependent upon the environment.

Figure 1:
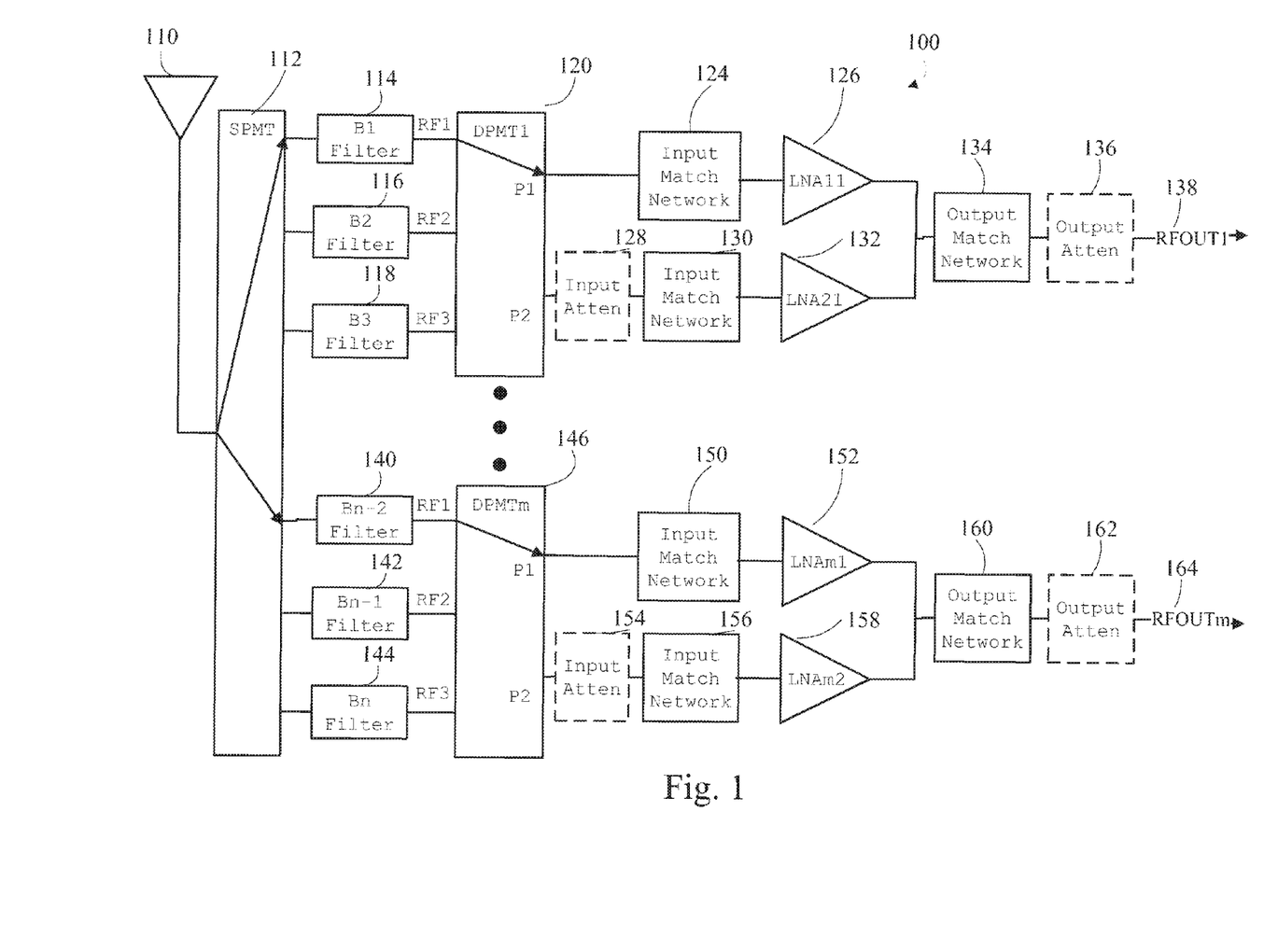
FIG. 1 is an overview of an example system having multiple dual pole multi-throw (DPMT)s in accordance with one embodiment of the disclosure.

One LNA may be split into multiple LNAs so that LNAs may be optimized for a specific environment. If the phone is in an urban area, then it would switch to the high linearity LNA, and if it is in rural areas, it would switch to a high gain LNA. The ability to use the RF front end in an urban environment and a rural environment may be met with two LNAs, one high gain and low noise and one optimized for high linearity, low gain and low current. One solution is to be able to switch between these two. The cell phone determines which LNA would be optimum. FIG. 1 shows multiple dual pole multi-throw switches (DPMT)s, the number of LNAs is arbitrary as the LNAs may be optimized for different specifications such as granular or transitional specifications. In another example one LNA may be made to perform as two LNAs by changing a bias current.

FIG. 1 depicts a first overall view of the device. Antenna 110 receives an RF signal which is analyzed by a baseband (not shown) that selects a band for receiving and sending. The selection of the appropriate band occurs at the single pole multi throw switch (SPMT) 112. After the frequency band is selected by the SPMT 112 the RF signal is filtered in one of the filters B1 114, B2 116, B3 118 Bn-2 140, Bn-1 142 and Bn 144. The actual number of throws, bands and filters may vary depending upon design. In this example the B1 filter 114 is selected and the RF signal RF1 is routed to the dual pole multi throw DPMT1 switch 120. At this point the baseband processor selects the most appropriate LNA based on the environment.

In this embodiment there are two LNAs per DPMT, one configured as a cascode common source LNA11 126 one configured as a cascode common gate LNA21 132. The cascode common source LNA11 126 has an input match network 124 connecting its input to pole 1 P1 of the DPMT. The cascode common gate LNA21 132 has an input attenuator 128 coupled to an input match network 130 coupled the input of LNA21 132. The LNAs may be optimized with LNA11 126 having the characteristic of high gain and low noise, and LNA21 132 having high linearity, low gain, and low current. In this example, several DPMTs (DPMT1 switch 120 and DPMTm switch 146) connect to the single SPMT 112 wherein the frequency band of the filters would be different for each DPMT. More than one throw of the SPMT 112 may be enabled in order to support carrier aggregation (CA), FIG. 1 shows two throws of SPMT 112 enabled wherein B1 114 and Bn-2 140 frequency bands may be aggregated. With respect to DPMT1 switch 120, when P1 is coupled to a given frequency band, B1 114, P2 is left isolated and uncoupled so that one pole of DPMT may be coupled to a given throw.

The outputs of LNA11 126 and LNA21 132 are tied together and the output RF signal RFOUT1 138 flows through an output match network 134 and an output attenuator 136. The input and output attenuators share a common design such as a PI network in the current example and may be seen in FIG. 6.

In this example, when high gain and low noise are required, the DPMT switch is configured such that the input signal is routed to LNA11 126. Similarly, when high linearity, lower gain, and lower current are requested, the DPMT routes the input signal to LNA21 132, one LNA is active and draws current at any given time.

Figure 4:
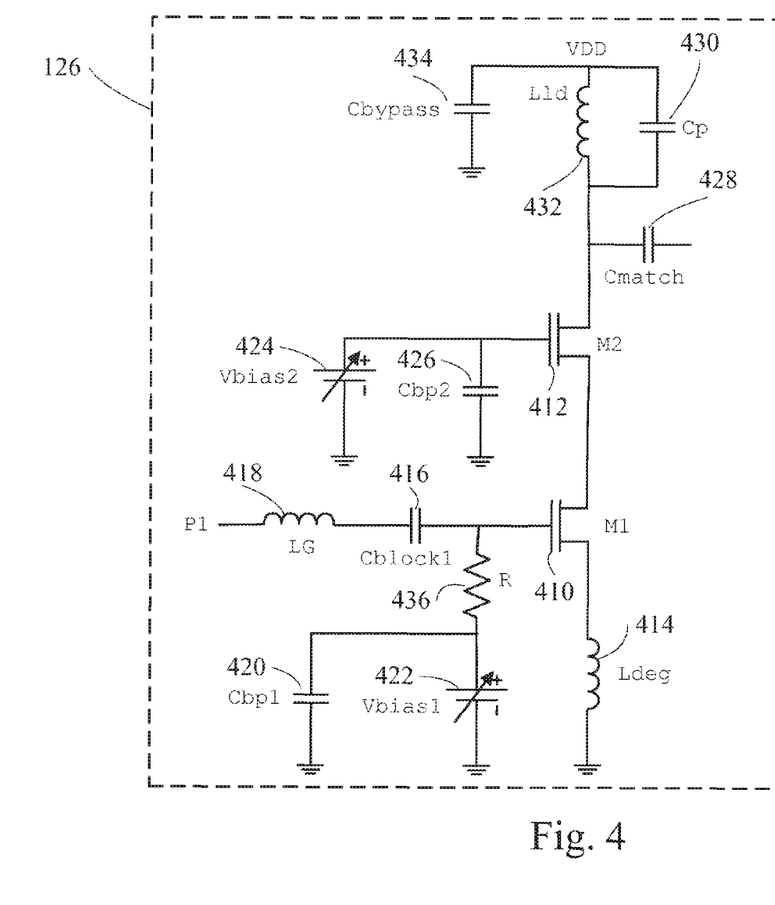
FIG. 4 is an example cascode common source LNA in accordance with one embodiment of the disclosure.

In this example, LNA11 126 employs the cascode common source architecture with inductive degeneration and matched load as shown in FIG. 4. It utilizes a fixed attenuator at the output in order to provide limited gain control. By enabling the output attenuator, the gain can be reduced by a fixed amount. The input matching inductor may be off-chip. This topology provides high gain and low noise. Due to the output attenuator 136, LNA11 126 may provide two gain control methods while other parameters such as linearity, noise figure, and current remain unchanged.

Figure 2:
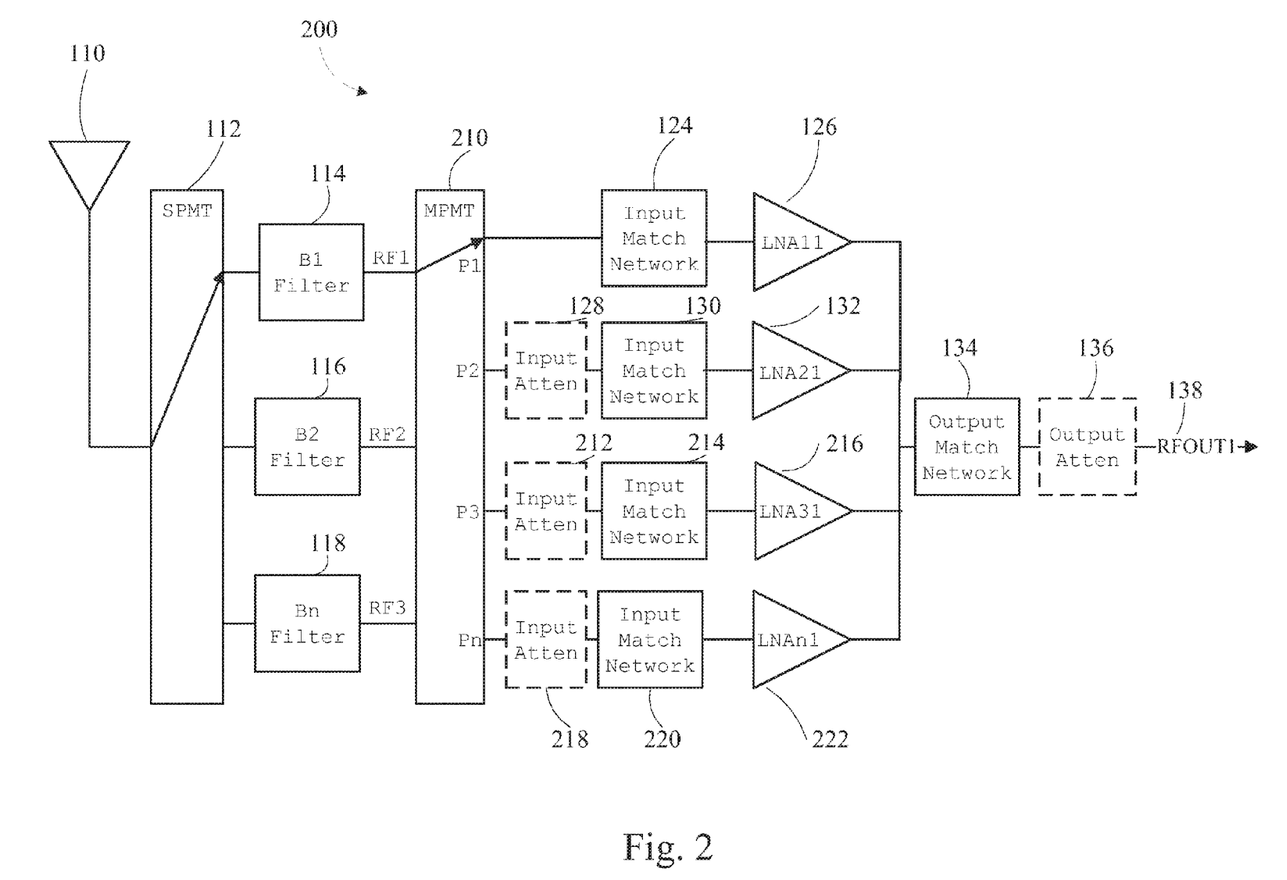
FIG. 2 is an overview of an example system having a multi-pole multi-throw (MPMT) and multiple LNAs in accordance with one embodiment of the disclosure.

FIG. 2 expands the DPMT1 of FIG. 1 to a multipole multi-throw switch (MPMT) 210 with the replacement of the DPMT with a multi pole multi throw MPMT switch that may select one of multiple LNAs depending upon the environment. In this example Input attenuators 212 and 218 feed input match networks 214 and 220 respectively that are coupled to LNA31 216 and LNAn1 222 respectively.

Figure 3:
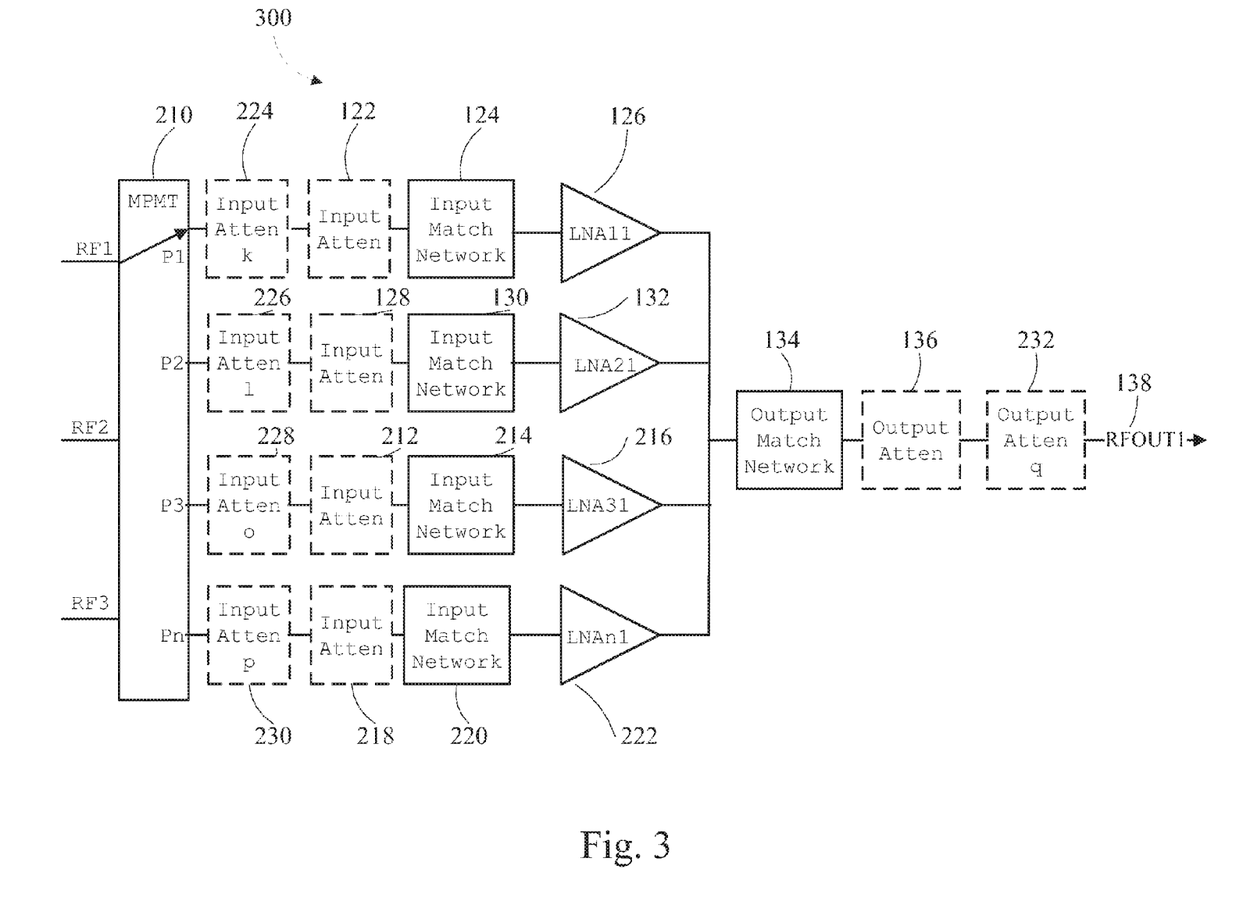
FIG. 3 is an overview of an example system having a multi-pole multi-throw (MPMT), multiple LNAs and multiple attenuators in accordance with one embodiment of the disclosure.

FIG. 3 is similar to FIG. 2 with the addition of an array of input and output attenuators 224, 226, 228, 230 and 232.

The attenuator has a fixed resistor in a PI network. For a fixed attenuation working in concert with the DPMT, the decision is made by the baseband that is monitoring the signal strength. If the phone is in an urban area and does not need a lot of gain, a command comes from the baseband to enable specific paths.

Additional attenuators may be added to an LNA for added gain. Adding an attenuator before the LNA improves linearity and adding attenuators to either the input or output improves return loss. The multiple LNAs per band may be enabled by the MPMT switch and enhanced by the attenuators. This allows additional LNAs for use in high signal strength and low signal strength environments.

FIG. 4 depicts a cascode common-source LNA1 1126. LNA11 126 employs a cascode common-source architecture with inductive degeneration and matched load. The cascode common source is comprised of two transistors in a stack M1 410 acting as the common source and M2 412 acting as a cascode.

In this example in the LNA11 126 block, the common source transistor M1 410 is configured to receive an RF signal coming in at P1. P1 is coupled to an inductor LG 418 coupled in series to a blocking capacitor Cblock1 416 which in turn is coupled to the gate of M1 410. The source of M1 410 is coupled to a degeneration inductor Ldeg 414. The gate of M1 is also coupled to a resistor R 436 at a first end and at a second end to a variable bias Vbias1 422 which is coupled to ground. The resistor R 436 second end is coupled to a bypass capacitor Cbp1 420.

The cascode transistor M2 412 has a gate coupled to a capacitor Cbp2 426 tied to ground. The source of M2 412 is tied to the drain of M1 410. The gate of M2 412 is coupled to a variable bias Vbias2 424.

In the drain of M2 412 is coupled to a tank which has a capacitor Cp 430 coupled in parallel to a load inductor Lld 432 and to a capacitor Cbypass 434. The drain of M2 is also coupled to a match capacitor Cmatch 428.

Figure 5:
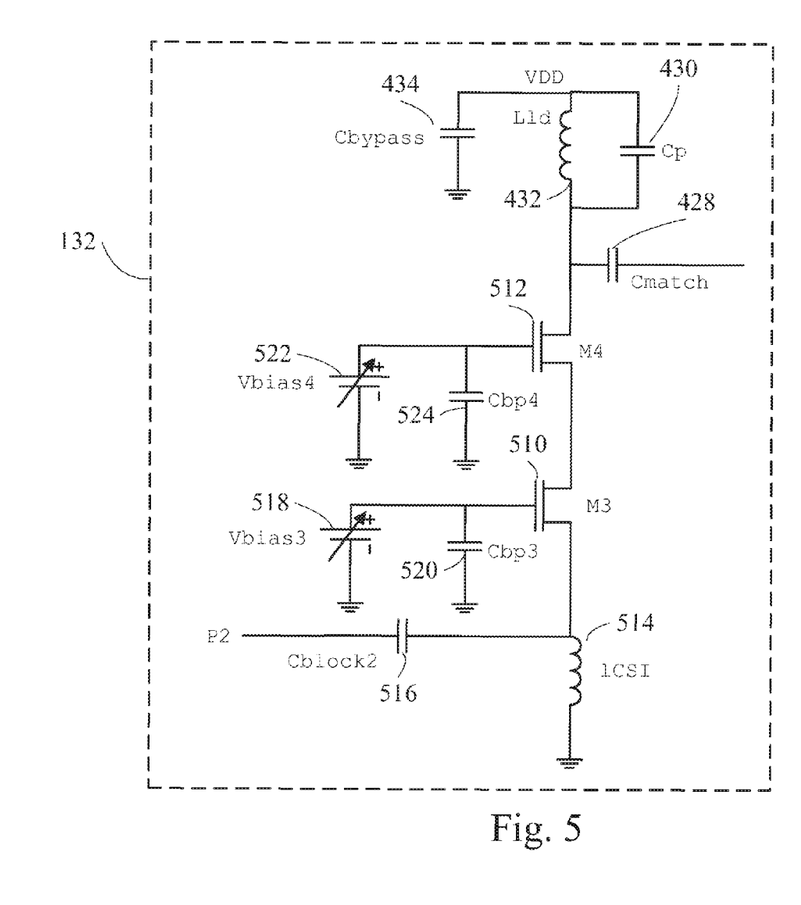
FIG. 5 is an example cascode common gate LNA in accordance with one embodiment of the disclosure.

FIG. 5 depicts LNA21 132, utilizing a cascode common-gate topology with inductive current source, and a matched load. When high linearity and low current are requested, LNA21 132 is enabled.

LNA21 132 is configured as two transistors in a cascode common gate configuration. With respect to the common gate transistor M3 510, blocking capacitor Cblock2 516 which is coupled to a source of M3 510 and an inductor Lcsi 514 that is tied to ground. The gate of M3 510 is coupled in parallel to capacitor Cbp3 520 a fixed capacitor and to a variable bias Vbias 3 518. Cbp3 520 and Vbias3 518 are tied to ground.

Cascode transistor M4 512 has a source coupled to the drain of M3 510. The gate of M4 512 is coupled in parallel to capacitor Cbp4 524 a fixed capacitor and a variable bias Vbias4 522. Cbp4 524 and Vbias 522 are tied to ground.

The drain of M4 512 is coupled to a tank which has a capacitor Cp 430 coupled in parallel to a load inductor Lld 432 and to a capacitor Cbypass 434. The drain of M4 512 is also coupled to a match capacitor Cmatch 428.

LNA11 126 and LNA21 132 share the same load and output matching network. Therefore, the output matching network is optimized for the case when LNA11 126 is enabled. For further flexibility, the output matching network can also be made programmable to provide better output return loss when LNA21 132 is enabled.

Figure 6:
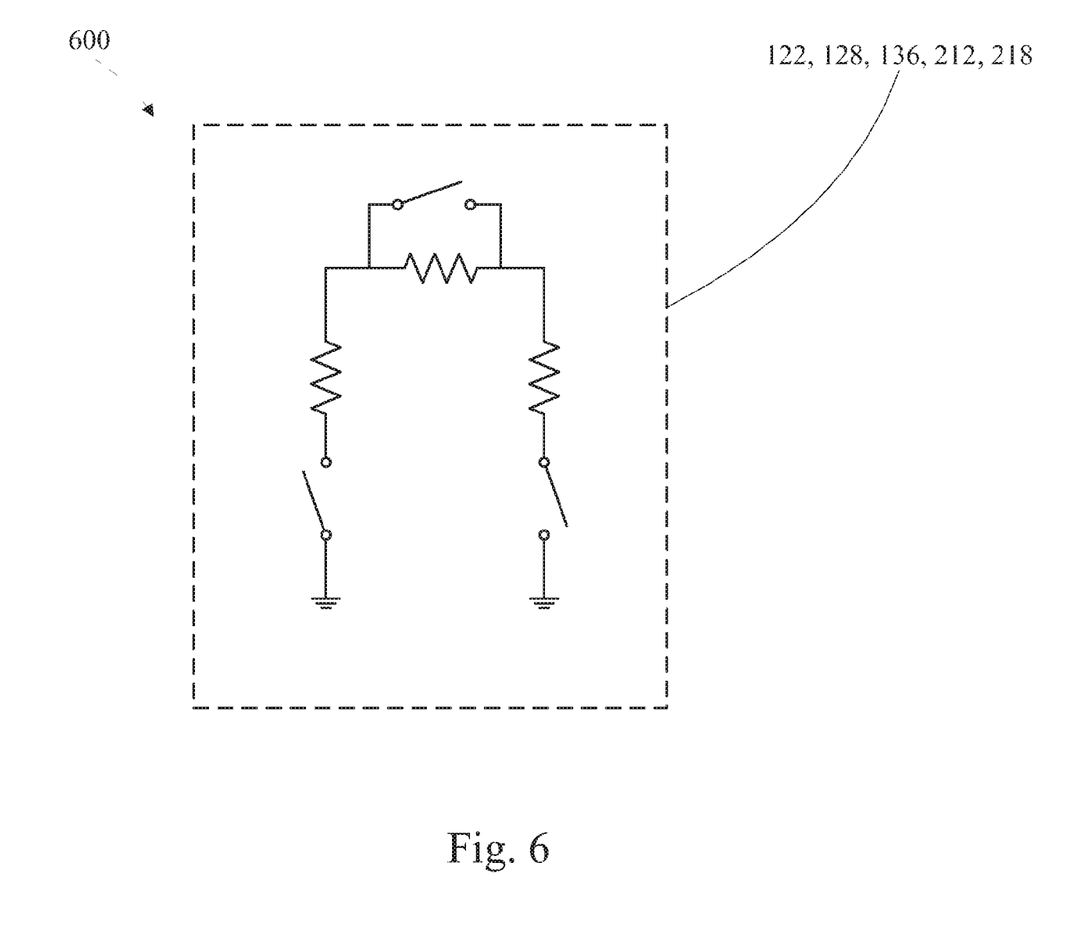
FIG. 6 is an example of an attenuator Pi network in accordance with one embodiment of the disclosure.

In FIG. 6 an example fixed attenuator is depicted, which has a fixed resistor in a PI network. The selection of attenuation and DPMT switch selection is made by the baseband that is monitoring the signal strength. If the phone is in an urban area and does not need a lot of gain, a command comes from the baseband to enable specific paths. If G0 is gain zero, G1 is gain 1, G2 is gain 2 and G3 is gain 3. G0 has a gain larger than G1, G1 has a gain larger than G2 and G2 has a gain larger than G3.

Figure 7:
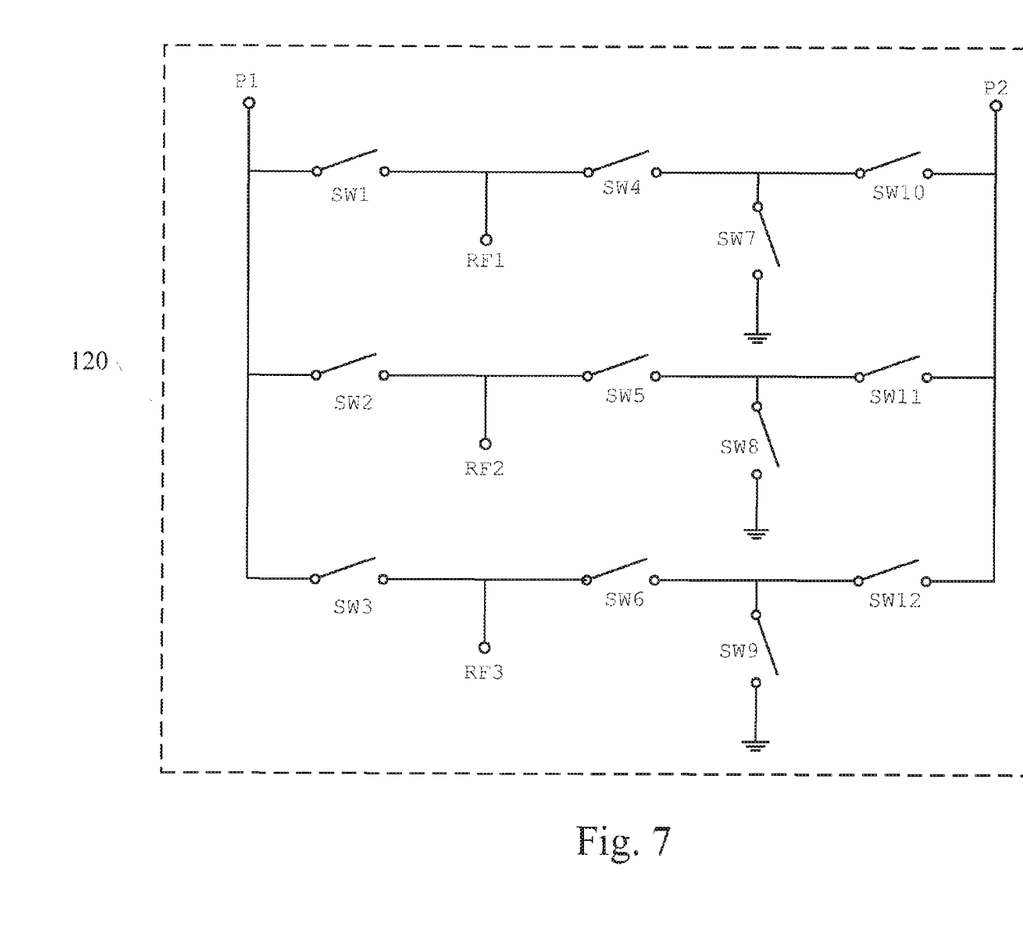
FIG. 7 is an example of a switch network in accordance with one embodiment of the disclosure.

FIG. 7 depicts one example of the DPMT switch. The DPMT switch isolates the input of LNA11 126 from the input of LNA21 132, as LNAs are sensitive to parasitic input capacitance. The DPMT switch reduces noise and improves input return loss especially at high frequencies.

Since LNA11 126 is very sensitive to any insertion loss at its input a thru topology was adopted. Within the thru topology, the thru-switches are SW1, SW2 and SW3. In order to improve the isolation between LNA11 P1 and LNA21 P2, a thru-shunt-thru architecture was used on the P2 path. Within the thru-shunt-thru architecture, the thru-switch portions are SW4, SW10, SW5, SW11, SW6 and SW12 and the shunt switch portions are SW7, SW8 and SW9.

The switches are bi-directional they can receive and transmit through the same switch. P1 is sensitive since it is high gain which means that insertion loss is not acceptable.

The LNA is programmable and is a reconfigurable in that it provides programmable linearity, current and gain. Programmability provides flexibility as more bands are added as it allows multiple frequency granularity and control. In one example the attenuators may be in series to allow selective attenuation.

Figure 8:
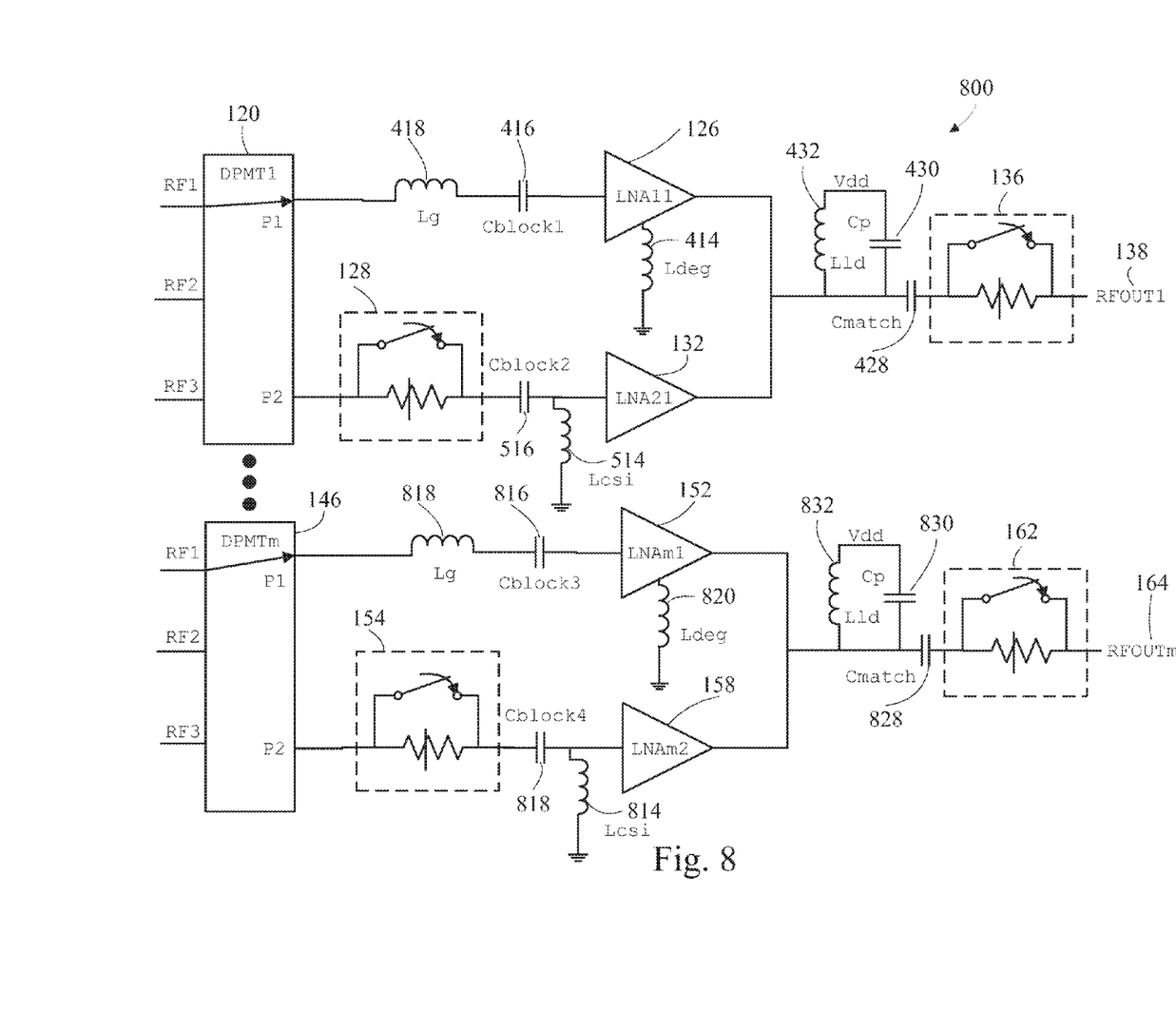
FIG. 8 is an overview of an example system having multiple DPMTs in accordance with one embodiment of the disclosure.

FIG. 8 is similar to FIG. 1 and shows in greater detail the components of one example of the disclosure. In this example the RF signal RF1 is routed to the dual pole multi throw DPMT1 switch 120. At this point the baseband processor selects the most appropriate LNA based on the environment. P1 is coupled to an inductor LG 418 coupled in series to a blocking capacitor Cblock1 416 which in turn is coupled to LNA11 126 that is coupled to a degeneration inductor Ldeg 414. An input attenuator 128 is coupled to a blocking capacitor Cblock2 516 which is coupled to an input of LNA21 132 and an inductor Lcsi 414514 that is tied to ground. The output of LNA11 126 and LNA21 132 are tied to a tank which has a capacitor Cp 430 coupled in parallel to a load inductor Lld 432. The outputs of LNA11 126 and LNA21 132 are coupled to a match capacitor Cmatch 428 which outputs to an output attenuator 136 outputting the RF signal RFOUT1 138.

Cmatch 428 is coupled to an output attenuator 136 outputting the RF signal RFOUT1 138. The fixed attenuator at the output provides limited gain control, by enabling the output to be reduced by a fixed amount. An input attenuator 128 is configured to receive an RF signal at P2. The input and output attenuators allow adjustment of gain and linearity. Using the attenuators at the input and output, the gain and linearity of LNA21 132 can be programmed. By adjusting the bias of the amplifiers of LNA2 132, its current, gain, and linearity can further be programmed. Therefore, LNA21 132 can provide two gain, linearity, and current control methods. Since LNA11 126 and LNA21 132 utilize an attenuator and output match network, these two attenuators and two output match networks may be combined into one output attenuator and one output match network. In a similar manner input attenuator 154 and output attenuator 162 provide the same functions for LNAm 152 and LNAm2 158.

In one example one LNA may act like two LNAs due to a digitally programmable bias. The feature added to address the above concern is a digitally programmable bias where the bias current of the receiver can be adjusted using software during operation. This programmable bias enables controlling the tradeoff among performance metrics.

This ability of software programmable bias to enable performance tradeoffs allows for two main benefits that are not possible with a static fixed bias, first it allows for design optimization of the product post fabrication. This simplifies design by reducing the need for precise bias design pre fabrication with the confidence that the final product can be adjusted to meet specifications. Post fabrication optimization also allows for the same product to be adjusted for different specs allowing one product to meet multiple demands. Second it allows for dynamically changing bias and performance during operation.

Figure 9:
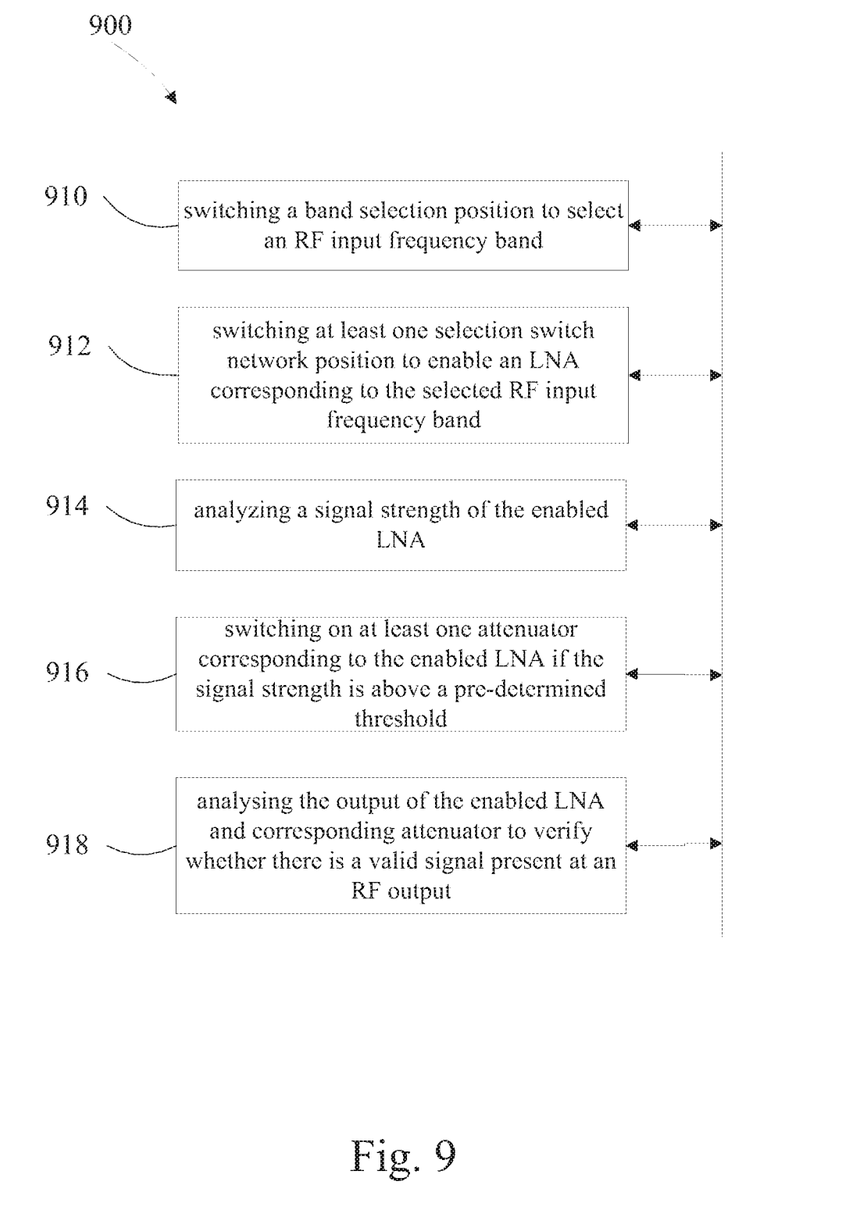
FIG. 9 is an example of a method of LNA programming in accordance with one embodiment of the disclosure.

An example method of programming an LNA is shown in FIG. 9. The method comprises switching 910 an SPMT position, i.e. band selection position, to select an RF input frequency band, switching 912 at least one DPMT position, i.e. selection switch network position, to enable an LNA corresponding to the selected RF input frequency band, analyzing 914 signal strength for the enabled LNA, switching 916 on at least one attenuator corresponding to the enabled LNA if the signal strength is strong, i.e. above a predetermined threshold, and analyzing 918 the output of the enabled LNA and corresponding attenuator to verify whether there is a valid signal present at an RF output.

Fabrication Technologies and Options

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As may be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaAs pHEMT, GaAs HBT and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation. Monolithic IC implementation is particularly useful since parasitic capacitances generally can be kept low by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

What is claimed is:

1. A selectable low noise amplifier (LNA) system comprising:
   a plurality of LNAs having a plurality of LNA characteristics; and
   at least one selection switch network coupled to at least one of the plurality of LNAs to select at least one of the plurality of LNAs,
   wherein at least one of the plurality of LNAs is configured as a cascode common source arrangement and at least one remaining LNA of the plurality of the LNAs is configured as a cascode common gate arrangement.

2. The selectable LNA system of claim 1 further comprising at least one output attenuator coupled to an output of at least one LNA of the plurality of LNAs, wherein the at least one output attenuator is selectable when the at least one LNA configured as cascode common source is operational.

3. The selectable LNA system of claim 1 further comprising at least one input attenuator coupled to an input of the at least one remaining LNA of the plurality of LNAs configured as cascode common gate, wherein the input attenuator is selectable at least when the at least one remaining LNA of the plurality of LNAs configured as common gate is operational.

4. The selectable LNA system of claim 1 wherein the selection switch network further comprises a plurality of poles correspondingly connecting an input signal to the plurality of LNAs.

5. A method of low noise amplification comprising:
   providing a plurality of LNAs having a plurality of LNA characteristics;
   configuring at least one of the plurality of LNAs as a cascode common source;
   configuring at least one remaining LNA of the plurality of LNAs as a cascode common gate; and
   enabling at least one LNA of the plurality of LNAs based on the plurality of LNA characteristics.

6. The selectable LNA system of claim 1, wherein the cascode common source arrangement comprises at least two cascode devices.

7. The selectable LNA system of claim 6, wherein one device of the at least two cascode-devices is configured as common gate and one device of the at least two cascode devices is configured as a common source.

8. The selectable LNA system of claim 1, wherein the cascode common gate arrangement comprises at least two cascode devices.

9. The selectable LNA system of claim 8, wherein two devices of the at least two cascode devices are configured as common gate.

10. The selectable LNA system of claim 7, wherein a gate of at least one device of the at least two cascode devices is coupled to a corresponding adjustable bias.

11. The selectable LNA system of claim 9, wherein a gate of at least one device of the at least two cascode devices is coupled to a corresponding adjustable bias.

12. The selectable LNA system of claim 4, wherein:
the selection switch network further comprises a throw, the throw being connected with an input of the selectable LNA system; and
the input signal is receivable via the input of the selectable LNA system.

13. The selectable LNA system of claim 4, wherein:
the selection switch network further comprises a plurality of throws, the plurality of throws being connected with a plurality of inputs of the selectable LNA system; and
the input signal is receivable via the plurality of inputs of the selectable LNA system.

14. The method of low noise amplification according to claim 5, wherein the plurality of LNA characteristics comprises noise figure, gain and linearity.

15. The selectable LNA system of claim 1, wherein the plurality of LNA characteristics comprises noise figure, gain and linearity.

16. The selectable LNA system of claim 2, wherein the at least one output attenuator is coupled to the output of the at least one LNA of the plurality of LNAs configured as cascode common source.

\* \* \* \* \*